(12) United States Patent
Yonekubo

(10) Patent No.: US 7,936,800 B2
(45) Date of Patent: May 3, 2011

(54) LIGHT SOURCE DEVICE AND PROJECTOR

(75) Inventor: Masatoshi Yonekubo, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 141 days.

(21) Appl. No.: 12/034,249

(22) Filed: Feb. 20, 2008

(65) Prior Publication Data

US 2008/0205459 A1     Aug. 28, 2008

(30) Foreign Application Priority Data

Feb. 22, 2007   (JP) ................................. 2007-041851

(51) Int. Cl.
*H01S 5/00* (2006.01)
(52) U.S. Cl. .................. 372/50.121; 372/50.12; 372/21; 372/22
(58) Field of Classification Search ... 372/50.12–50.124
See application file for complete search history.

(56) References Cited

U.S. PATENT DOCUMENTS

| | | | | |
|---|---|---|---|---|
| 4,718,069 A | * | 1/1988 | Streifer et al. | ............. 372/50.12 |
| 4,751,711 A | * | 6/1988 | Welch et al. | ............. 372/50.123 |
| 6,721,342 B2 | | 4/2004 | Yabuki et al. | |
| 7,376,168 B2 | | 5/2008 | Mikhailov et al. | |
| 2006/0023173 A1 | | 2/2006 | Mooradian et al. | |
| 2006/0023757 A1 | | 2/2006 | Mooradian et al. | |
| 2006/0165144 A1 | | 7/2006 | Mikhailov et al. | |
| 2006/0268241 A1 | | 11/2006 | Watson et al. | |
| 2006/0280219 A1 | * | 12/2006 | Shchegrov | ...................... 372/99 |
| 2006/0285568 A1 | * | 12/2006 | Watanabe et al. | ........ 372/50.121 |
| 2007/0153862 A1 | | 7/2007 | Shchegrov et al. | |
| 2007/0153866 A1 | | 7/2007 | Shchegrov et al. | |

FOREIGN PATENT DOCUMENTS

| | | |
|---|---|---|
| JP | A-6-132610 | 5/1994 |
| JP | A-2003-209313 | 7/2003 |
| JP | A 2004-144794 | 5/2004 |
| JP | A-2005-537643 | 12/2005 |
| JP | A-2006-343712 | 12/2006 |
| JP | A-2008-004743 | 1/2008 |

OTHER PUBLICATIONS

Mooradian, A. et al. "High Power Extended Vertical Cavity Surface Emitting Diode Lasers and Arrays and Their Applications." Micro-Optics Conference, Tokyo, Nov. 2, 2005.

* cited by examiner

*Primary Examiner* — Tod T Van Roy
(74) *Attorney, Agent, or Firm* — Oliff & Berridge, PLC

(57) ABSTRACT

A light source device includes a plurality of light emission sections disposed in parallel with an interval, wherein the interval for the light emission sections near each end portion in an array of the light emission sections is narrower than the interval near a center portion in the array.

4 Claims, 17 Drawing Sheets

LIGHT SOURCE DEVICE AND PROJECTOR

BACKGROUND

1. Technical Field

The present invention relates to a light source device and a projector and, more specifically, to a technology for a light source device that makes a supply of laser lights.

2. Related Art

For a light source device of a projector, the technology recently proposed is of using a laser light source that makes a supply of laser lights. Compared with a UHP (Ultra High Performance) lamp that has been previously used as a light source device of a projector, a light source device using a laser light source has advantages of having a high color reproducibility, being turned on instantaneously, and being long in life, for example. The projector has been expected to be high in intensity. To make such a laser light source higher in power, a plurality of light emission sections may be disposed in parallel for emission of laser lights. As an example, refer to Non-Patent Document 1 and FIG. 3 thereof (Aram Mooradian and other 13, "High Power Extended Vertical Cavity Surface Emitting Diode Lasers and Arrays and Their Applications", Micro-Optics Conference, [Online], Novalux Inc. [Search on Jan. 30, 2007], the Internet <URL: http://www/novalux.com/assets/downloads/NECSEL_Arrays_Apps.pdf>

The oscillation wavelength of a laser light source is known as changing its optimum value depending on the temperature. In an array of a plurality of light emission sections disposed in parallel, the farther the portion is from the center portion, the better and easier the heat dissipation will be in the area. It means that the closer the area to either end of the array of the light emission sections, the higher the characteristics of heat dissipation will be in the area. If this is the case, a temperature difference is observed between the light emission sections located in the center portion and those in the end portions, thereby possibly causing a difference also to the oscillation wavelength. As prevention measures therefor, if a wavelength conversion element or an external resonator corresponding to any specific wavelength is used, the resulting laser lights will suffer from a lower efficiency of light emission. The desired laser lights are of uniform in oscillation wavelength. Another issue here is that when coherent laser lights are directed onto the surface for light diffusion, an interference pattern called speckle pattern sometimes appears in which bright and dark spots appear at random. For reduction of such a speckle noise, slightly varying the wavelength on a light emission basis is considered beneficial. In this case, it is desirable to make available laser lights varying in wavelength. A laser light source provided with a plurality of light emission sections as such is thus expected to provide lights being the results of wavelength adjustment performed in accordance with the objects with a simple technique.

SUMMARY

An advantage of some aspects of the invention is to provide a light source device that can supply lights through with wavelength adjustment performed in accordance with the objects with a simple technique, and a projector using the light source device.

A first aspect of the invention is directed to a light source device that includes a plurality of light emission sections disposed in parallel with an interval. In the light source device, the interval for the light emission sections near each end portion in an array of the light emission sections is narrower than the interval near a center portion in the array.

With such a configuration that, in an array of the light emission sections being disposed in parallel, an interval is made narrower near each end portion than that near a center portion so that the light emission sections can be uniform in temperature. With the light emission sections being uniform in temperature as such, lights coming therefrom can be also uniform in wavelength with the lights being uniform in wavelength as such, the light emission can be performed with a high efficiency. Accordingly, with such a simple method of only adjusting the interval between the light emission sections, it becomes able to make a supply of lights through with wavelength adjustment. As such, with a simple technique, derived is a light source device being able to make a supply of lights through with wavelength adjustment performed in accordance with the objects.

According to a second aspect of the invention, in the first aspect, preferably, the light source device further includes: an external resonator for producing a resonance in a light coming from the light emission sections; and a wavelength conversion element provided to an optical path between the array of the light emission sections and the external resonator for performing wavelength conversion to the light coming from the light emission sections. In the light source device, at a position corresponding to any of the light emission sections located near the center portion, the wavelength conversion element performs the wavelength conversion to a light of a wavelength substantially the same as a wavelength of a light to be subjected to the wavelength conversion at a position corresponding to any of the light emission sections near the end portions. For lights made uniform in wavelength, the combination use with such a wavelength conversion element performing wavelength conversion to laser lights of substantially the same wavelength enables wavelength conversion with a good efficiency for lights coming from each of the light emission sections. As such, the lights through with wavelength conversion can be emitted with a satisfactory efficiency.

A third aspect of the invention is directed to a light source device that includes: a plurality of light emission sections disposed in parallel with an interval. In the light source device, the interval for the light emission sections near a center portion in an array of the light emission sections is narrower than the interval near each end portion in the array.

With such a configuration that, in an array of the light emission sections disposed in parallel, an interval near a center portion is made narrower than that near each end portion so that the light emission sections can greatly vary in temperature. In the light emission sections, the higher temperature leads to emission of lights with a longer wavelength. By increasing the temperature difference among the light emission sections as such, the resulting lights also vary in wavelength, thereby being able to reduce any possible speckle noise. Accordingly, with such a simple method of only adjusting the interval between the light emission sections, it becomes able to make a supply of lights through with wavelength adjustment. As such, with a simple technique, derived is a light source device being able to make a supply of lights through with wavelength adjustment performed in accordance with the objects.

According to a fourth aspect of the invention, in the third aspect, preferably, the light source device further includes an external resonator for producing a resonance in a light coming from the light emission sections; and a wavelength conversion element provided to an optical path between the array of the light emission sections and the external resonator for performing wavelength conversion to the light coming from the light emission sections. In the light source device, at a position corresponding to any of the light emission sections located near the center portion, the wavelength conversion element performs the wavelength conversion to a light of a wavelength longer than a wavelength of a light to be subjected to the wavelength conversion at a position corresponding to any of the light emission sections near the end portions. With such a configuration as enabling wavelength conversion to any lights with a long wavelength at the position corresponding to the center portion being high in temperature, wavelength conversion for lights coming from the light emission sections can be performed with a good efficiency. As such, the lights through with wavelength conversion can be emitted with a satisfactory efficiency.

According to a fifth aspect of the invention, in the fourth aspect, preferably, the light source device further includes a wavelength selection element provided between the wavelength conversion element and the external resonator. In the light source device, at the position corresponding to any of the light emission sections located near the center portion, the wavelength selection element passes through a light of a wavelength longer than a wavelength of a light to be passed through at the position corresponding to any of the light emission sections near the end portions. By making the wavelength selection element to selectively pass through the lights from each of the light emission sections, resonance can be produced in the lights using the external resonator. This accordingly enables, with a simple configuration, to produce resonance in lights varying in wavelength.

A sixth aspect of the invention is directed to a light source device that includes a plurality of light emission sections disposed in parallel with an interval. In the light source devicer the interval for the light emission sections near a first end portion in an array of the light emission sections is narrower than the interval near a second end portion in the array.

With such a configuration that, in an array of the light emission sections disposed in parallel, an interval is narrower near the first end portion than that near the second end portion, the light emission sections can greatly vary in temperature. With the light emission sections greatly varying in temperature as such, lights coming therefrom can also vary in wavelength so that any possible speckle noise can be reduced. Accordingly, with such a simple method of only adjusting the interval between the light emission sections, it becomes able to make a supply of lights through with wavelength adjustment. As such, with a simple technique, derived is a light source device being able to make a supply of lights through with wavelength adjustment performed in accordance with the objects.

According to a seventh aspect of the invention, in the sixth aspect, preferably, the light source device further includes: an external resonator for producing a resonance in a light coming from the light emission sections; and a wavelength conversion element provided to an optical path between the array of the light emission sections and the external resonator for performing wavelength conversion to the light coming from the light emission sections. In the light source device, at a position corresponding to any of the light emission sections located near the first end portion, the wavelength conversion element performs the wavelength conversion to a light of a wavelength longer than a wavelength of a light to be subjected to the wavelength conversion at a position corresponding to any of the light emission sections near the second end portion. In the light emission sections, the higher temperature leads to emission of lights with a longer wavelength. By enabling wavelength conversion to any lights with a long wavelength at the position corresponding to the first end portion being high in temperature, wavelength conversion for lights coming from the light emission sections can be performed with a good efficiency. As such, the lights through with wavelength conversion can be emitted with a satisfactory efficiency.

According to an eighth aspect of the invention, in the seventh aspect, preferably, the light source device further includes a wavelength selection element provided between the wavelength conversion element and the external resonator. In the light source device, at the position corresponding to any of the light emission sections located near the first end portion, the wavelength selection element passes through a light of a wavelength longer than a wavelength of a light to be passed through at the position corresponding to any of the light emission sections near the second end portion. By making the wavelength selection element to selectively pass through the lights from each of the light emission sections, resonance can be produced in the lights using the external resonator. This accordingly enables, with a simple configuration, to produce resonance in lights varying in wavelength.

According to a ninth aspect of the invention, in the first aspect, preferably, the light emission sections each emit a laser light. This thus favorably allows a supply of laser lights adjusted in wavelength in accordance with the objects.

A tenth aspect of the invention is directed to a projector that includes: the light source device described above; and a spatial light modulation device that modulates a light from the light source device in accordance with an image signal. As such, using the light source device described above enables to easily make a supply of lights adjusted in wavelength in accordance with the objects. This accordingly leads to a projector that can display bright images of high quality with a simple technique.

BRIEF DESCRIPTION OF THE DRAWINGS

The invention will be described with reference to the accompanying drawings, wherein like numbers reference like elements.

FIG. 10 is a diagram showing the relationship between the position on the wavelength conversion element and the wavelength of laser lights to be passed through.

FIG. 16 is a diagram showing the relationship between the position on the wavelength conversion element and the wavelength of laser lights to be passed through.

DESCRIPTION OF EXEMPLARY EMBODIMENTS

In the below, by referring to the accompanying drawings, embodiments of the invention are described in detail.

First Embodiment

Figure 1:
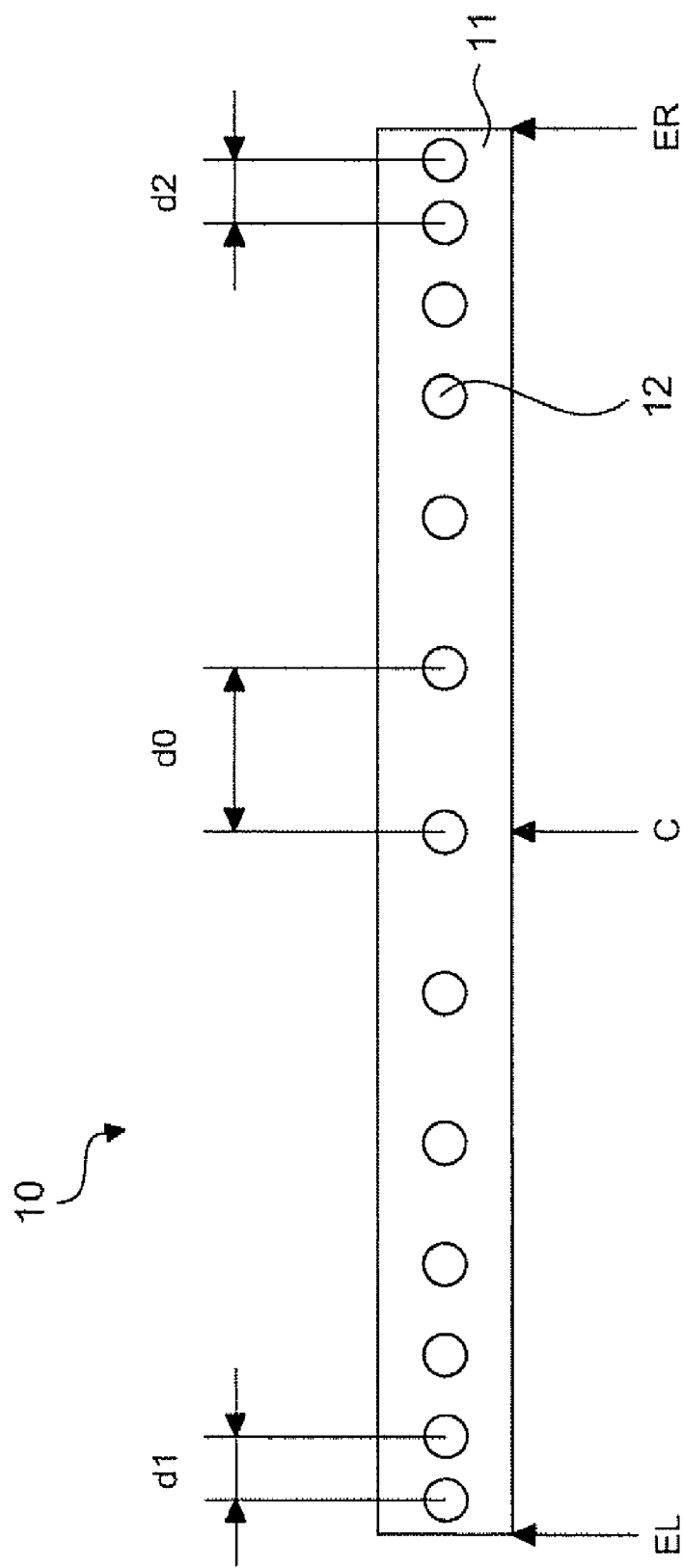
FIG. 1 is a diagram showing the configuration of a top surface of a light source device in a first embodiment of the invention.

FIG. 1 is a diagram showing the configuration of a top surface of a light source device 10 in a first embodiment of the invention. The light source device 10 is provided with a semiconductor laser 11, which is of a surface-emitting type serving as a light source section that makes a supply of coherent laser lights. The semiconductor laser 11 is provided with a plurality of light emission sections 12 disposed in parallel with an interval. The number of the light emission sections 12 is not restrictive to that in FIG. 1, and may take any value as long as it is larger than one.

In the array of the light emission sections 12, the light emission sections 12 are so disposed that the interval is gradually reduced from a center portion C to a left end portion EL, and from the center portion C to a right end portion ER. The interval d1 between the light emission sections 12 closest to the left end portion EL is narrower than the interval d0 between the light emission sections 12 closest to the center portion C, i.e., d1<d0. The interval d2 between the light emission sections 12 closest to the right end portion ER is narrower than the interval d0 between the light emission sections 12 closest to the center portion C, i.e., d2<d0. As such, the light emission sections 12 are so disposed that the intervals d1 and d2 in the vicinity of the end portions EL and ER are both narrower than the interval d0 in the vicinity of the center portion C.

Figure 2:
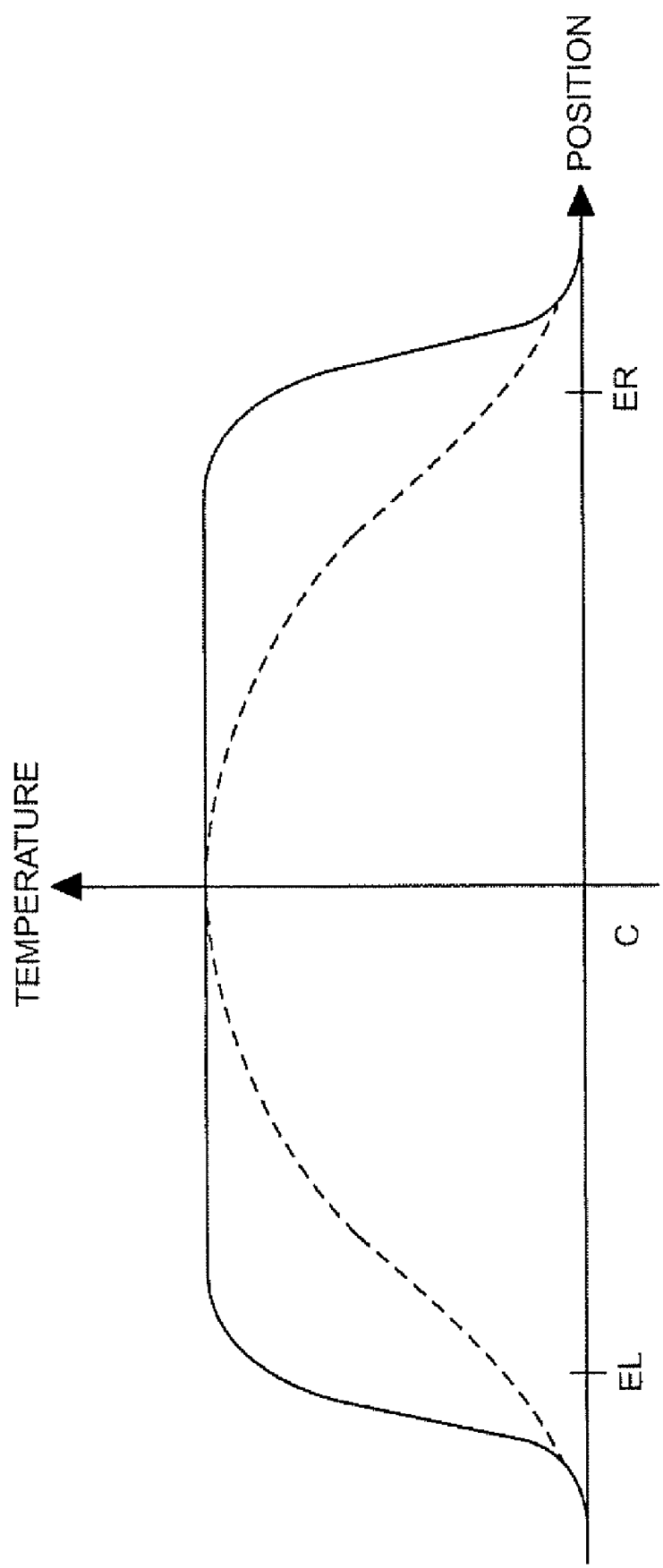
FIG. 2 is a diagram showing the relationship among light emission sections in terms of the position and the temperature.

FIG. 2 is a diagram showing the relationship among the light emission sections 12 in terms of the position and the temperature. In a previous light source device including a plurality of light emission sections 12, generally, the interval among the light emission sections 12 is substantially the same. In the resulting array of the light emission sections 12, the farther the portion is from the center portion, the better and easier the heat dissipation will be in the area. This resultantly causes, as indicated by a broken line in the drawing, a temperature distribution in which the temperature is the highest in the center portion C, and is reduced toward the end portions EL and ER. Due to such a temperature difference observed among the light emission sections 12 located near the center portion C and those located near the end portions EL and ER, the oscillation wavelength may also vary.

On the other hand, with the light source device 10 in the first embodiment of invention, in an array of the light emission sections 12 disposed in parallel, an interval near the end portions EL and ER is made narrower than that near the center portion C. This favorably enables to make uniform the light emission sections 12 in temperature as indicated by a solid line in the drawing. With the light emission sections 12 being uniform in temperature as such, laser lights coming therefrom can be also uniform in wavelength. With the lights being uniform in wavelength as such, the light emission can be performed with a high efficiency. Accordingly, with such a simple method of only adjusting the interval between the light emission sections 12, it becomes able to make a supply of laser lights through with wavelength adjustment. As such, with a simple technique, there are effects of being able to make a supply of lights through with wavelength adjustment in accordance with the objects.

Figure 3:
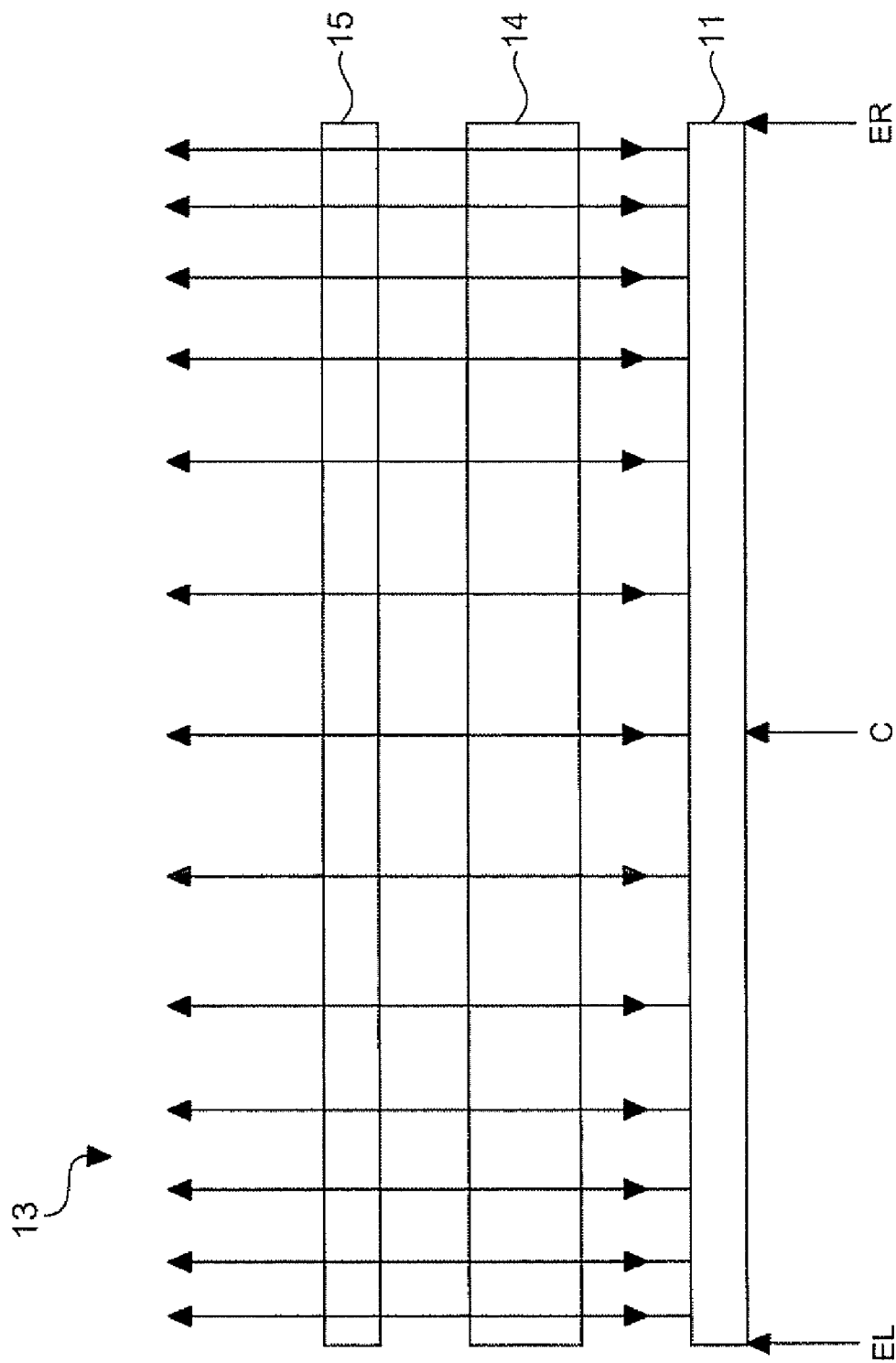
FIG. 3 is a diagram showing the schematic configuration of a light source device provided with a wavelength conversion element and an external resonator.

FIG. 3 shows the schematic configuration of a light source device 13 in which the above-described semiconductor laser 11 is equipped with a wavelength conversion element 14 and an external resonator 15. The external resonator 15 serves to produce a resonance in laser lights coming from each of the light emission sections 12 (refer to FIG. 1) provided to the semiconductor laser 11. The wavelength conversion element 14 is provided on an optical path between the array of the light emission sections 12 and the external resonator 15. The wavelength conversion element 14 serves to convert the wavelength of the laser lights coming from each of the light emission sections 12.

The wavelength conversion element 14 is exemplified by an SHG (Second-Harmonic Generation) element, which converts the laser lights from the semiconductor laser 11 into laser lights with a wavelength of one half thereof, and emits the resulting laser lights. Such an SHG element is made of nonlinear optical crystal, for example. The nonlinear optical crystal can be PPLN (Periodically Poled Lithium Niobate) of lithium niobate ($LiNbO_3$), for example. The wavelength conversion element 14 is of a polarization-reversed configuration with a pitch corresponding to the wavelength of the laser lights coming from the light emission sections 12.

The external resonator 15 selectively reflects any laser lights that have been passed through the wavelength conversion element 14 with no wavelength conversion. The laser lights are then directed by the external resonator 15 in the direction of the semiconductor laser 11, and then are reflected by a mirror layer (not shown) of the semiconductor laser 11. After being reflected by the mirror layer and the external resonator 15, a resonance is produced in both the laser lights together and lights newly coming from the light emission sections 12, and are then amplified. The laser lights as the results of wavelength conversion by the wavelength conversion element 14 pass through the external resonator 15, and are emitted from the light source device 13. Note here that the external resonator 15 may be applied to the light source device 10 of FIG. 1.

The wavelength conversion element 14 performs wavelength conversion to laser lights at the position corresponding to any of the light emission sections 12 near the center portion C. The laser lights to be subjected to wavelength conversion here are of substantially the same wavelength as laser lights to be subjected to wavelength conversion at the position corresponding to any of the light emission sections 12 near the end portions EL and ER. For the semiconductor laser 11 that can make a supply of laser lights uniform in oscillation wavelength, the combination use with such a wavelength conversion element 14 performing wavelength conversion to laser lights of substantially the same wavelength enables wavelength conversion with a good efficiency for laser lights coming from each of the light emission sections 12. This accordingly leads to emission, with a high efficiency, of lights being the results of such wavelength conversion.

Figure 4:
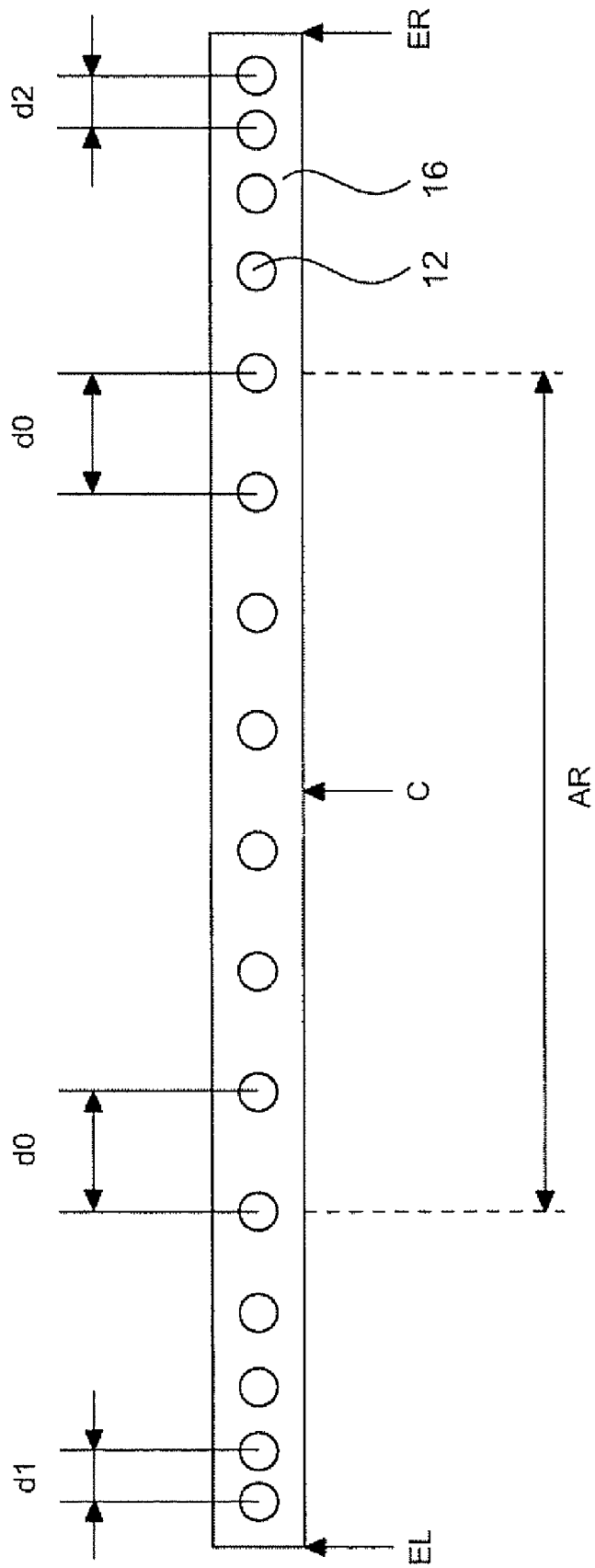
FIG. 4 is a diagram for illustrating the configuration in which the light emission sections are disposed at regular intervals in a fixed area.

Note here that such a configuration is not the only option for the light source devices 10 and 13, i.e., the interval of the light emission sections 12 is gradually reduced from the center portion C toward the end portions EL and ER. As long as the light emission section 12 can be made uniform in temperature, a part of a plurality of light emission sections 12 may be disposed at the same interval. As an example, with a semiconductor laser 16 of FIG. 4, the light emission sections 12 are disposed at regular intervals of d0 in a fixed area AR with the center portion C located at the center. When the light emission sections 12 are disposed in parallel in a long portion, the light emission sections 12 can be uniform in temperature even if the interval in the fixed area AR is d0, i.e., at regular interval, and the interval is reduced near the end portions EL and ER, i.e., intervals d1 and d2. Still alternatively, the interval of the light emission sections 12 may be determined as appropriate in accordance with the degree of heat dissipation of the semiconductor laser.

In the light source devices 10 and 13, because the interval of the light emission sections 12 is set to be narrower for some portion in the array as such, this allows more light emission sections 12 to be disposed in parallel compared with the configuration of including the light emission sections 12 at substantially regular interval. Even if many light emission sections 12 are disposed in parallel in any fixed size of area as such, the temperature difference among the light emission sections 12 can be still reduced, thereby being able not to reduce the efficiency of light emission.

Second Embodiment

Figure 5:
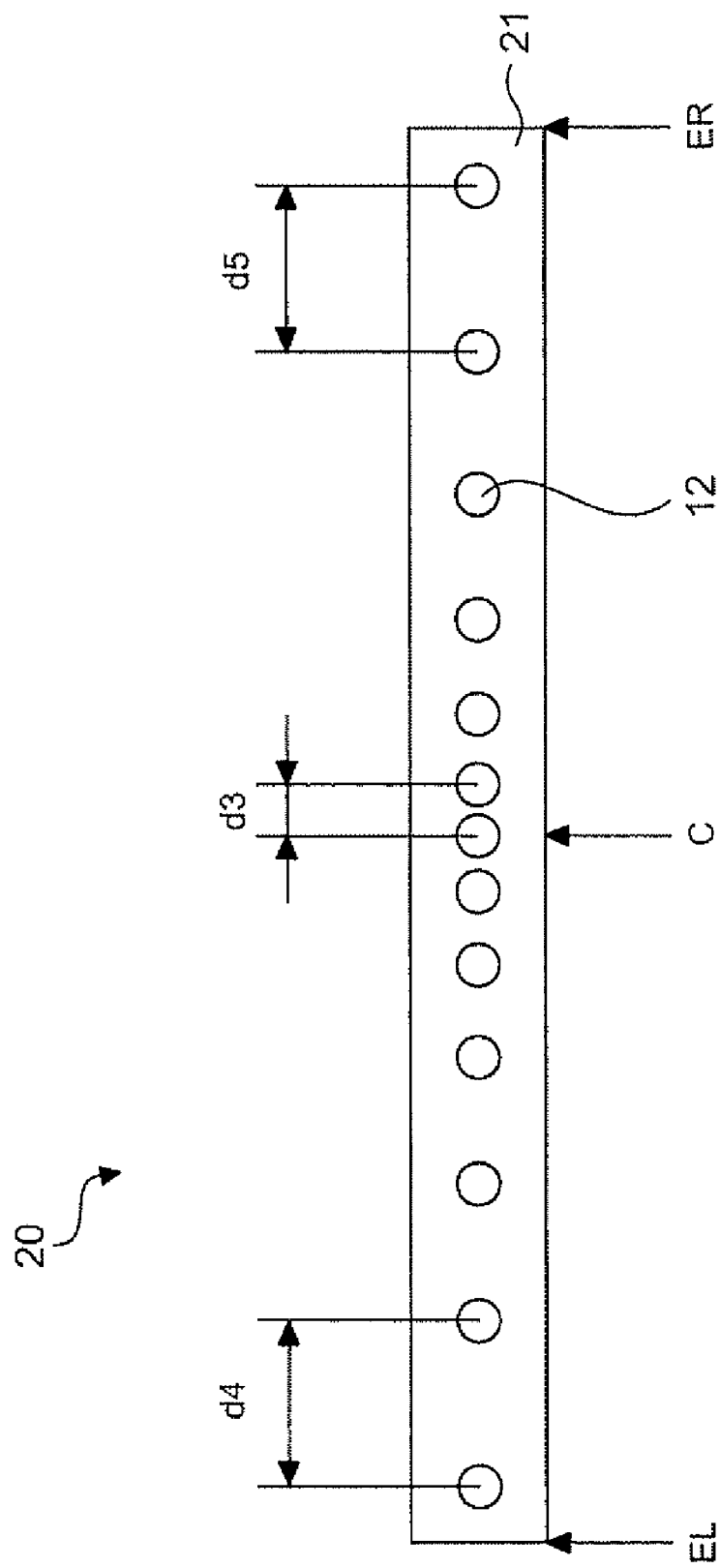
FIG. 5 is a diagram showing the configuration of a top surface of a light source device in a second embodiment of the invention.

FIG. 5 shows the configuration of a top surface of a light source device 20 in a second embodiment of the invention. The light source device 20 is provided with a semiconductor laser 21, which is of a surface-emitting type serving as a light source section that makes a supply of coherent laser lights. The semiconductor laser 21 is provided with a plurality of light emission sections 12 disposed in parallel with an interval. Herein, any component same as that in the first embodiment is provided with the same reference numeral, and not described twice.

In the array of the light emission sections 12, the light emission sections 12 are so disposed that the interval is gradually reduced from a left end portion EL to a center portion C, and from a right end portion ER to the center portion C. The interval d3 between the light emission sections 12 closest to the center portion C is narrower than the interval d4 between the light emission sections 12 closest to the left end portion EL, i.e., d3<d4. The interval d3 between the light emission sections 12 closest to the center portion C is narrower than the interval d5 between the light emission sections 12 closest to the right end portion ER, i.e., d3<d5. As such, the light emission sections 12 are so disposed that the interval d3 in the vicinity of the center portion C is narrower than the intervals d4 and d5 in the vicinity of the end portions EL and ER.

Figure 6:
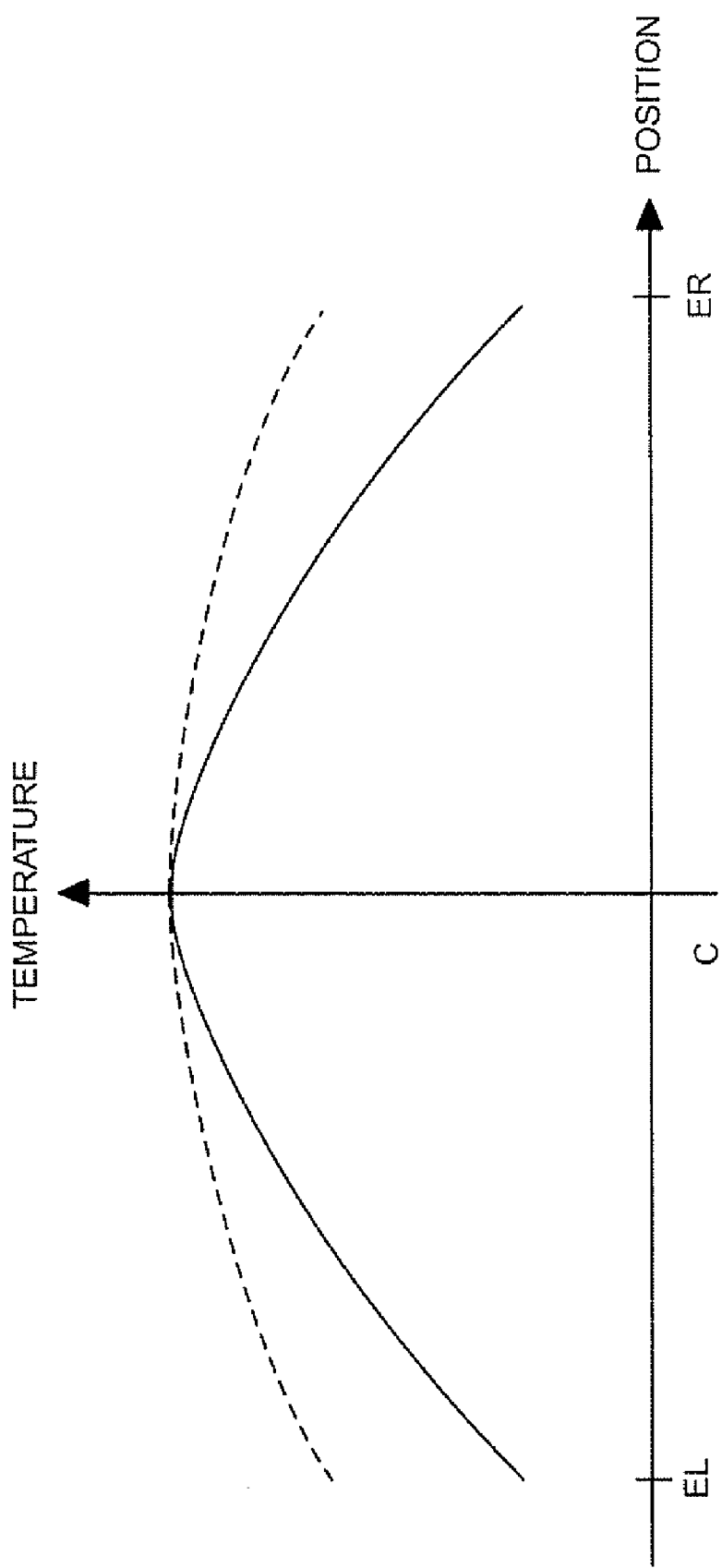
FIG. 6 is a diagram showing the relationship among light emission sections in terms of the position and the temperature.

FIG. 6 is a diagram showing the relationship among the light emission sections 12 in terms of the position and the temperature. When the light emission sections are disposed in parallel at substantially regular interval as has been previously configured, in the resulting array of the light emission sections, as is indicated by a broken line in the drawing, observed is a temperature distribution in which the temperature is the highest in the center portion C, and is reduced toward the end portions EL and ER. On the other hand, with the light source device 20 in the second embodiment of invention, in an array of the light emission sections 12 disposed in parallel, an interval near the center portion C is made narrower than that near the end portions EL and ER. This favorably allows the light emission sections 12 to greatly vary in temperature as indicated by a solid line in the drawing.

Figure 7:
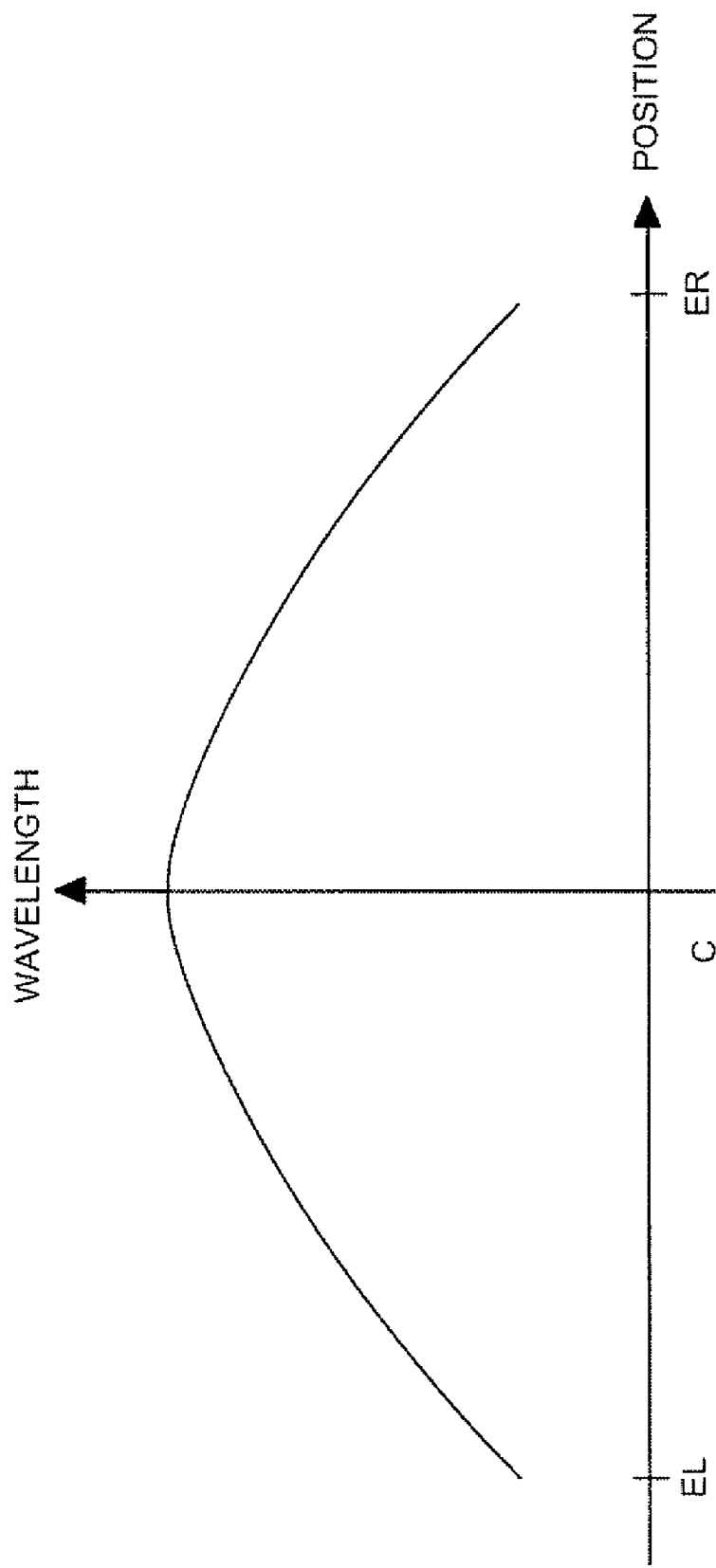
FIG. 7 is a diagram showing the relationship among the light emission sections in terms of the position and the wavelength of laser lights emitted therefrom.

FIG. 7 shows the relationship among the light emission sections 12 in terms of the position thereof and the wavelength of laser lights emitted therefrom. The higher the temperature in the light emission sections 12, the longer the wavelength of the laser lights will be. Due to the temperature distribution of FIG. 6, the semiconductor laser 21 emits laser lights with a wavelength distribution, i.e., the wavelength is the longest near the center portion C, and is reduced toward the end portions EL and ER, By increasing the temperature difference among the light emission sections 12, the resulting laser lights can have a wide wavelength range, e.g., in this embodiment, the laser lights can have a wavelength range of about a few nm to 10 nm. With a supply of laser lights varying in wavelength as such, any possible speckle noise can be reduced. Accordingly, with such a simple method of only adjusting the interval between the light emission sections 12, it becomes able to make a supply of laser lights through with wavelength adjustment. As such, with a simple technique, there are effects of being able to make a supply of lights through with wavelength adjustment in accordance with the objects.

Figure 8:
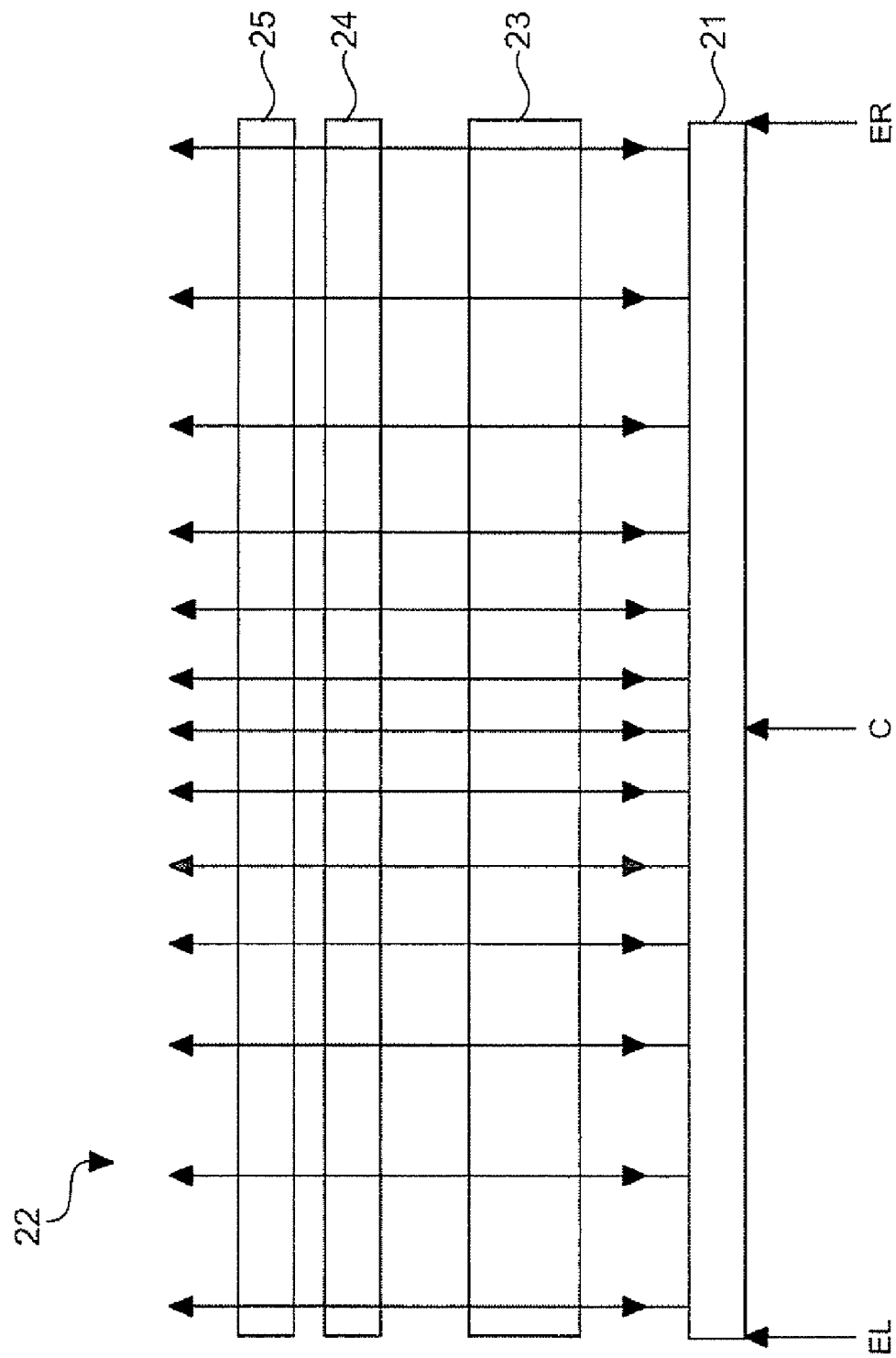
FIG. 8 is a diagram showing the schematic configuration of a light source device provided with a wavelength conversion element and an external resonator.

FIG. 8 shows the schematic configuration of a light source device 22 in which the above-described semiconductor laser 21 is equipped with a wavelength conversion element 23 and an external resonator 25. The external resonator 25 serves to produce a resonance in laser lights coming from each of the light emission sections 12 (refer to FIG. 5) provided to the semiconductor laser 21. The wavelength conversion element 23 is provided on an optical path between the array of the light emission sections 12 and the external resonator 25. The wavelength conversion element 23 serves to convert the wavelength of the laser lights coming from each of the light emission sections 12. The wavelength conversion element 23 is exemplified by an SHG element. A wavelength selection element 24 is disposed between the wavelength conversion element 23 and the external resonator 25. The wavelength selection element 24 selectively passes through laser lights of a predetermined wavelength. Note here that the wavelength selection element 24 and the external resonator 25 may be applied to the light source device 20 of FIG. 5.

Figure 9:
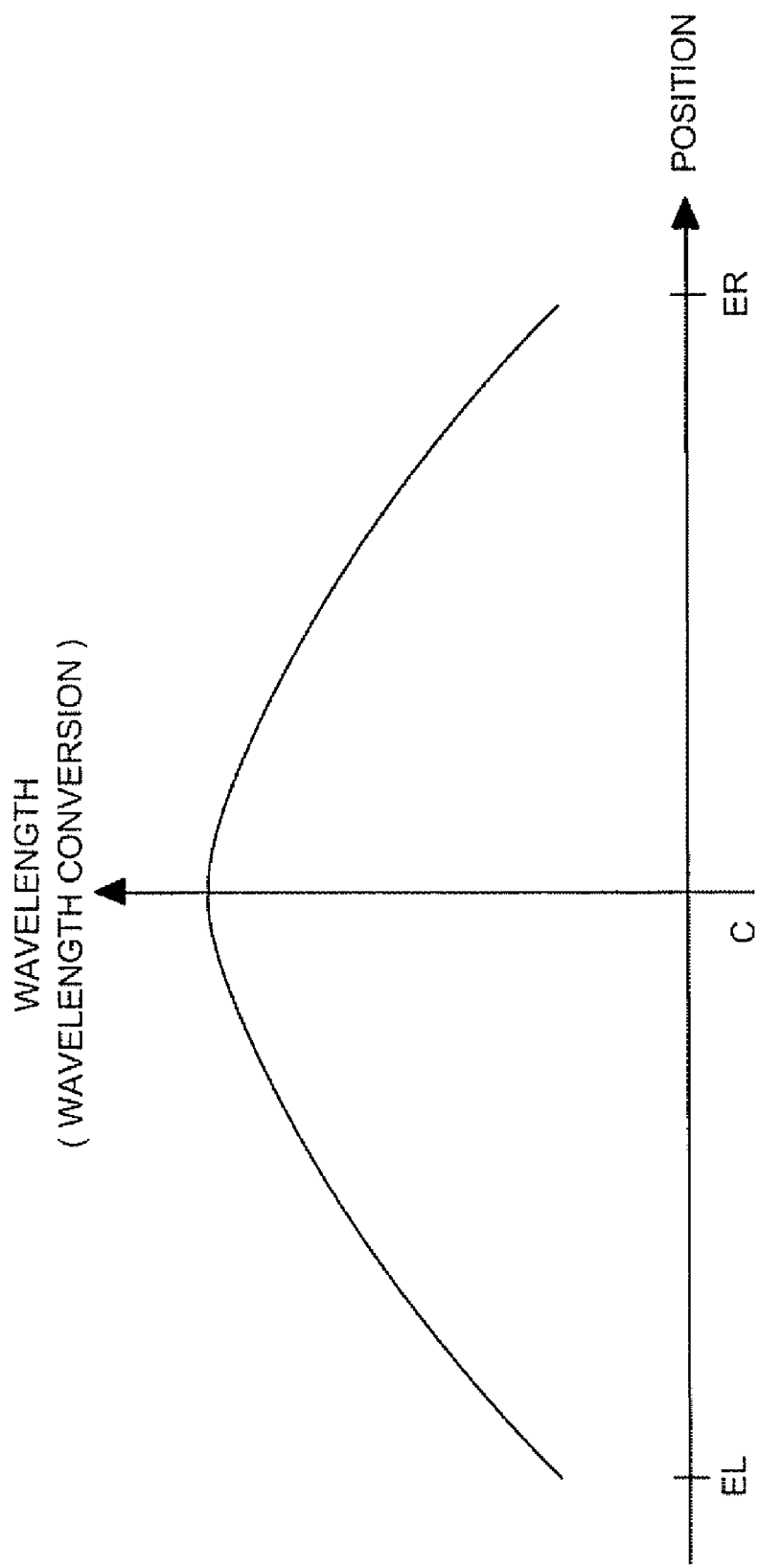
FIG. 9 is a diagram showing the relationship between the position on the wavelength conversion element and the wavelength of laser lights.

FIG. 9 shows the relationship between the position on the wavelength conversion element 23 and the wavelength of laser lights for wavelength conversion. The laser lights to be subjected to wavelength conversion by the wavelength conversion element 23 have the longest wavelength at the position corresponding to the center portion C, and show the reduction of wavelength toward the end portions EL and ER. The wavelength conversion element 23 performs wavelength conversion to laser lights at the position corresponding to any of the light emission sections 12 near the center portion C. The laser lights to be subjected to wavelength conversion here are of the wavelength longer than that of laser lights to be subjected to wavelength conversion at the position corresponding to any of the light emission sections 12 near the end portions EL and ER. The wavelength conversion element 23 with such characteristics of wavelength conversion is derived by forming the polarization-reversed configuration with a pitch smaller for the area closer to the positions corresponding to the end portions ER and EL. By adjusting the pitch of the polarization-reversed configuration corresponding to the wavelength of the laser lights coming from the light emission sections 12, the wavelength conversion for the laser lights from the light emission sections 12 can be performed with a good efficiency.

Figure 10:
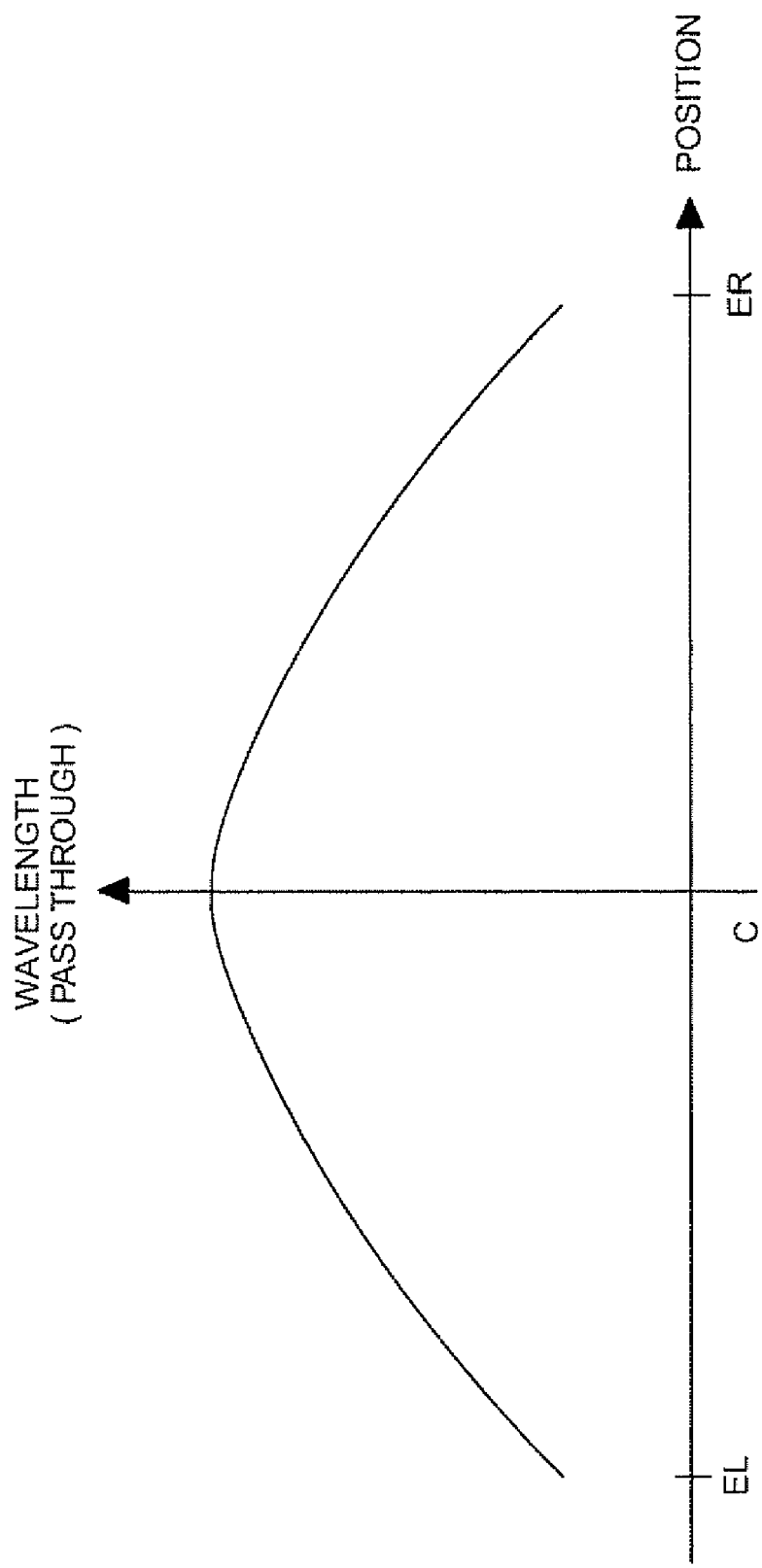

FIG. 10 shows the relationship between the position on the wavelength selection element 24 and the wavelength of laser lights to be passed through by the wavelength selection element 24. The laser lights to be passed through by the wavelength selection element 24 have the longest wavelength at the position corresponding to the center portion C, and show the reduction of wavelength toward the end portions EL and ER. The wavelength selection element 24 passes through laser lights at the position corresponding to any of the light emission sections 12 near the center portion C. The laser lights to be subjected to wavelength conversion here are of the wavelength longer than that of laser lights to be passed through at the position corresponding to any of the light emission sections 12 near the end portions EL and ER. The wavelength selection element 24 with such characteristics of light transmission is exemplified by a dielectric multi-layer whose thickness is reduced toward the positions corresponding to the end portions EL and ER.

By referring back to FIG. 8, the external resonator 25 selectively reflects any laser lights that have been passed through the wavelength conversion element 23 with no wavelength conversion and then passed through the wavelength selection element 24. The external resonator 25 has the characteristics of reflection, irrespective of the position thereon, that can reflect laser lights coming from the light emission sections 12 with any predetermined wavelength range. By making the wavelength selection element 24 to selectively pass through laser lights from the light emission sections 12, resonance can be produced in the laser lights using the external resonator 25. As such, with a simple configuration, resonance can be produced in the laser lights varying in oscillation wavelength.

The wavelength selection element 24 has not only the characteristics of light transmission as such but also the characteristics of passing through laser lights through with wavelength conversion by the wavelength conversion element 23. The laser lights through with wavelength conversion by the wavelength conversion element 23 as such pass through both the wavelength selection element 24 and the external resonator 25, and then are emitted from the light source device 22. By subjecting laser lights varying in oscillation wavelength to wavelength conversion as such, the resulting laser lights coming from the light source device 22 accordingly vary in wavelength. With a supply of laser lights varying in wavelength as such, any possible speckle noise can be reduced. Accordingly, with such a simple method of only adjusting the interval between the light emission sections 12, it becomes able to make a supply of laser lights through with wavelength adjustment. As such, with a simple technique, there are effects of being able to make a supply of lights through with wavelength adjustment in accordance with the objects.

Note here that such a configuration is not the only option for the light source devices 20 and 22, i.e., the interval of the light emission sections 12 is gradually reduced toward the center portion C from the end portions EL and ER. As long as the light emission sections 12 can provide laser lights varying in wavelength, a part of a plurality of light emission sections 12 may be disposed at the same interval.

Third Embodiment

Figure 11:
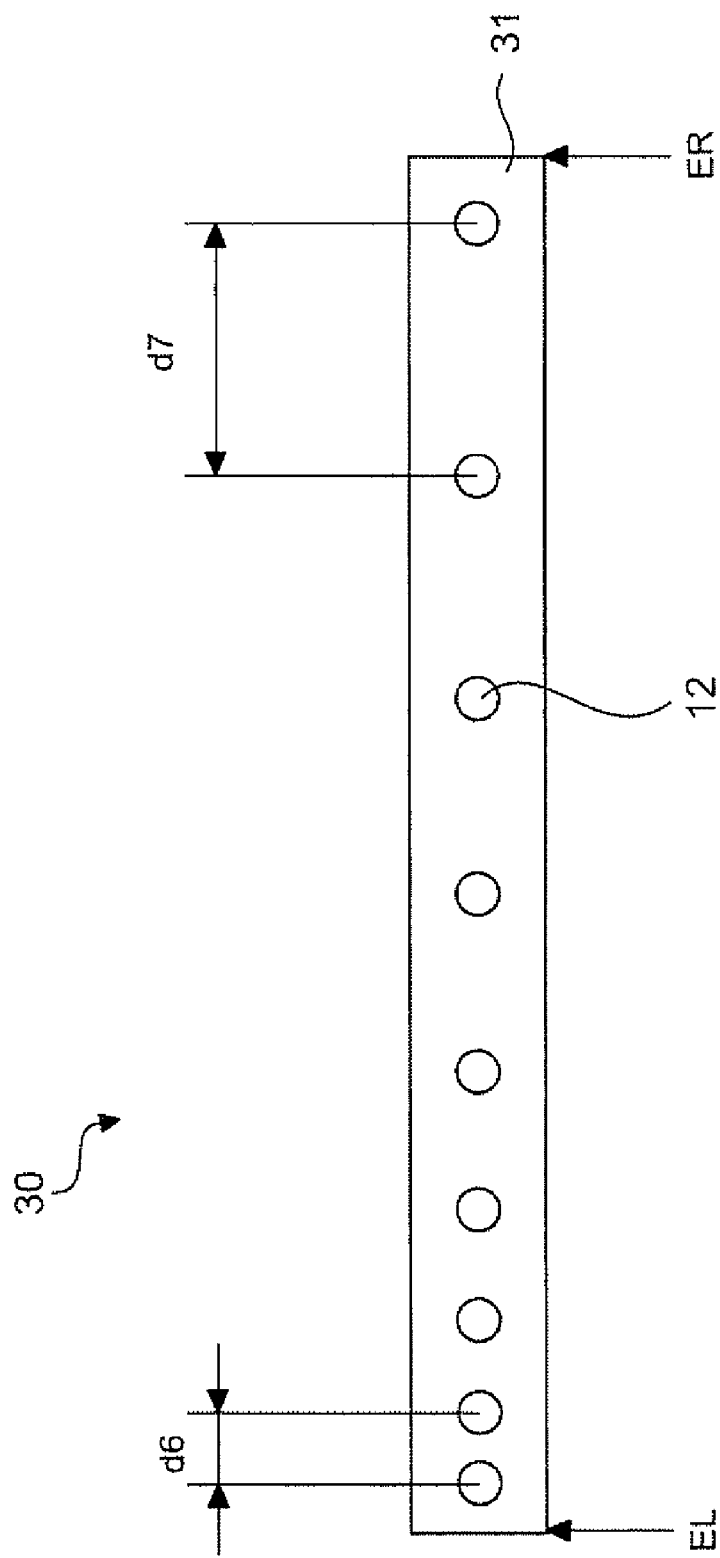
FIG. 11 is a diagram showing the configuration of a top surface of a light source device in a third embodiment of the invention.

FIG. 11 shows the configuration of a top surface of a light source device 30 in a third embodiment of the invention. The light source device 30 is provided with a semiconductor laser 31, which is of a surface-emitting type serving as a light source section that makes a supply of coherent laser lights. The semiconductor laser 31 is provided with a plurality of light emission sections 12 disposed in parallel with an interval. Herein, any component same as that in the first embodiment is provided with the same reference numeral, and not described twice.

In the array of the light emission sections 12, the light emission sections 12 are so disposed that the interval is gradually reduced from a right end portion ER being a second end portion to a left end portion EL being a first end portion. The interval d6 between the light emission sections 12 closest to the left end portion EL is narrower than the interval d7 between the light emission sections 12 closest to the right end portion ER, i.e., d6<d7. As such, the light emission sections 12 are so disposed that the interval d6 in the vicinity of the left end portion EL is narrower than the interval d7 in the vicinity of the right end portion ER.

Figure 12:
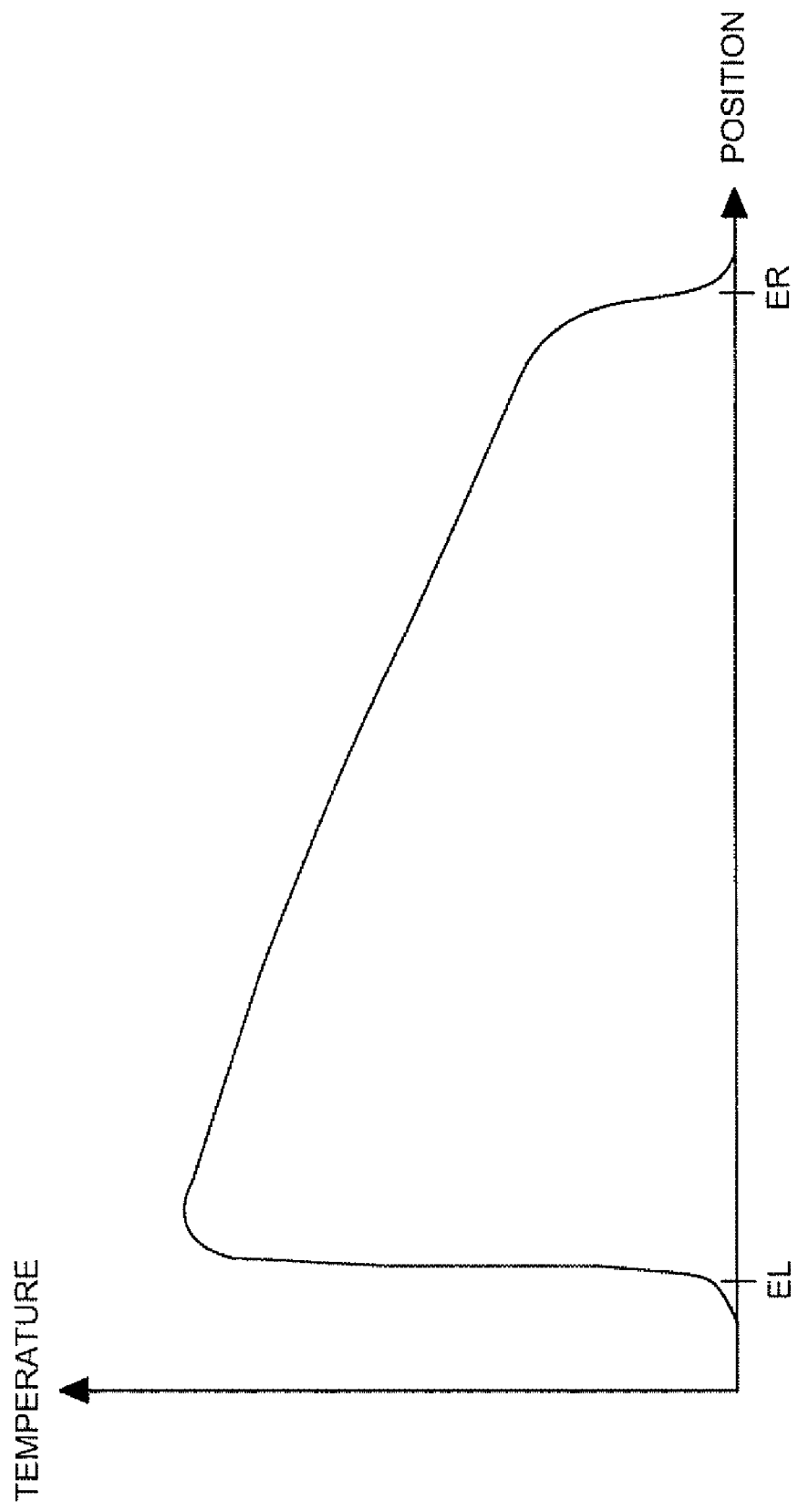
FIG. 12 is a diagram showing the relationship among light emission sections in terms of the position and the temperature.

FIG. 12 is a diagram showing the relationship among the light emission sections 12 in terms of the position and the temperature in the light source device 30, the father the portion is from the left end portion EL, the better and easier the heat dissipation will be in the area closer to the right end portion ER. As such, in the light source device 30, observed is a temperature distribution in which the temperature is the highest at the left end portion EL, and is reduced toward the right end portion ER.

Figure 13:
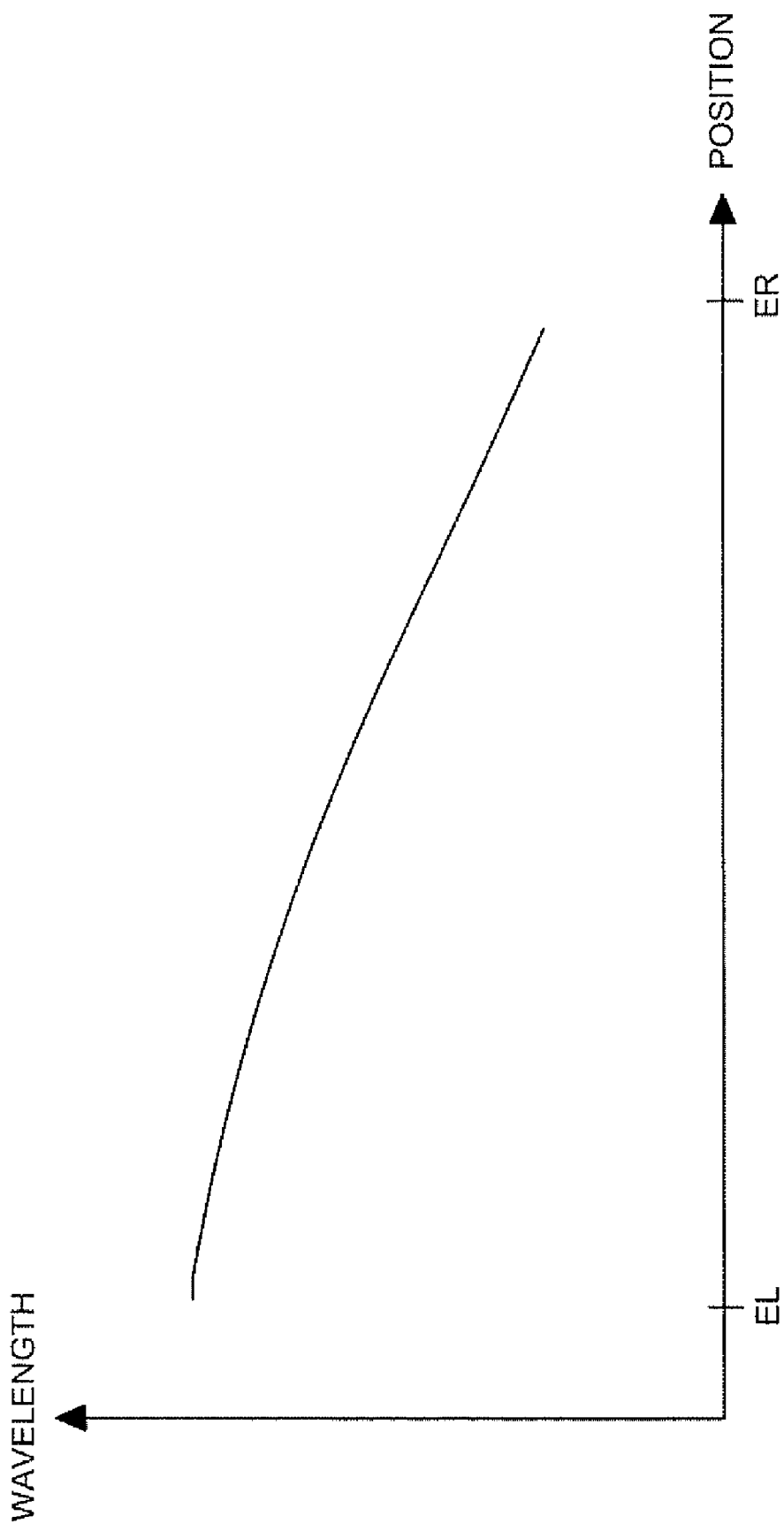
FIG. 13 is a diagram showing the relationship among the light emission sections in terms of the position and the wavelength of laser lights emitted therefrom.

FIG. 13 shows the relationship among the light emission sections 12 in terms of the position thereof and the wavelength of laser lights emitted therefrom. The higher the temperature in the light emission sections 12, the longer the wavelength of the resulting laser lights will be. Due to the temperature distribution of FIG. 12, the semiconductor laser 31 emits laser lights with a wavelength distribution, i.e., the wavelength is the longest at the left end portion EL, and is reduced toward the right end portion ER. In this embodiment, the laser lights can have a wavelength range of about a few nm to 10 nm. With a supply of laser lights varying in wavelength as such, any possible speckle noise can be reduced. Accordingly, with such a simple method of only adjusting the interval between the light emission sections 12, it becomes able to make a supply of laser lights through with wavelength adjustment. As such, with a simple technique, there are effects of being able to make a supply of lights through with wavelength adjustment in accordance with the objects.

For the purpose of enhancing the temperature distribution of FIG. 12, the light source device 30 may be so configured as to cool the semiconductor laser 31. If this is the configuration, the wavelength range can be increased to a further extent for the laser lights. As an exemplary case where a refrigerant is moved to flow from the right end portion ER of the semiconductor laser 31 to the left end portion EL thereof, the refrigerant cools the left end portion EL after being exposed to the heat at the right end portion ER. In this case, the right end portion ER can be cooled with a higher efficiency compared with the left end portion EL, thereby being able to enhance the temperature distribution of FIG. 12.

Figure 14:
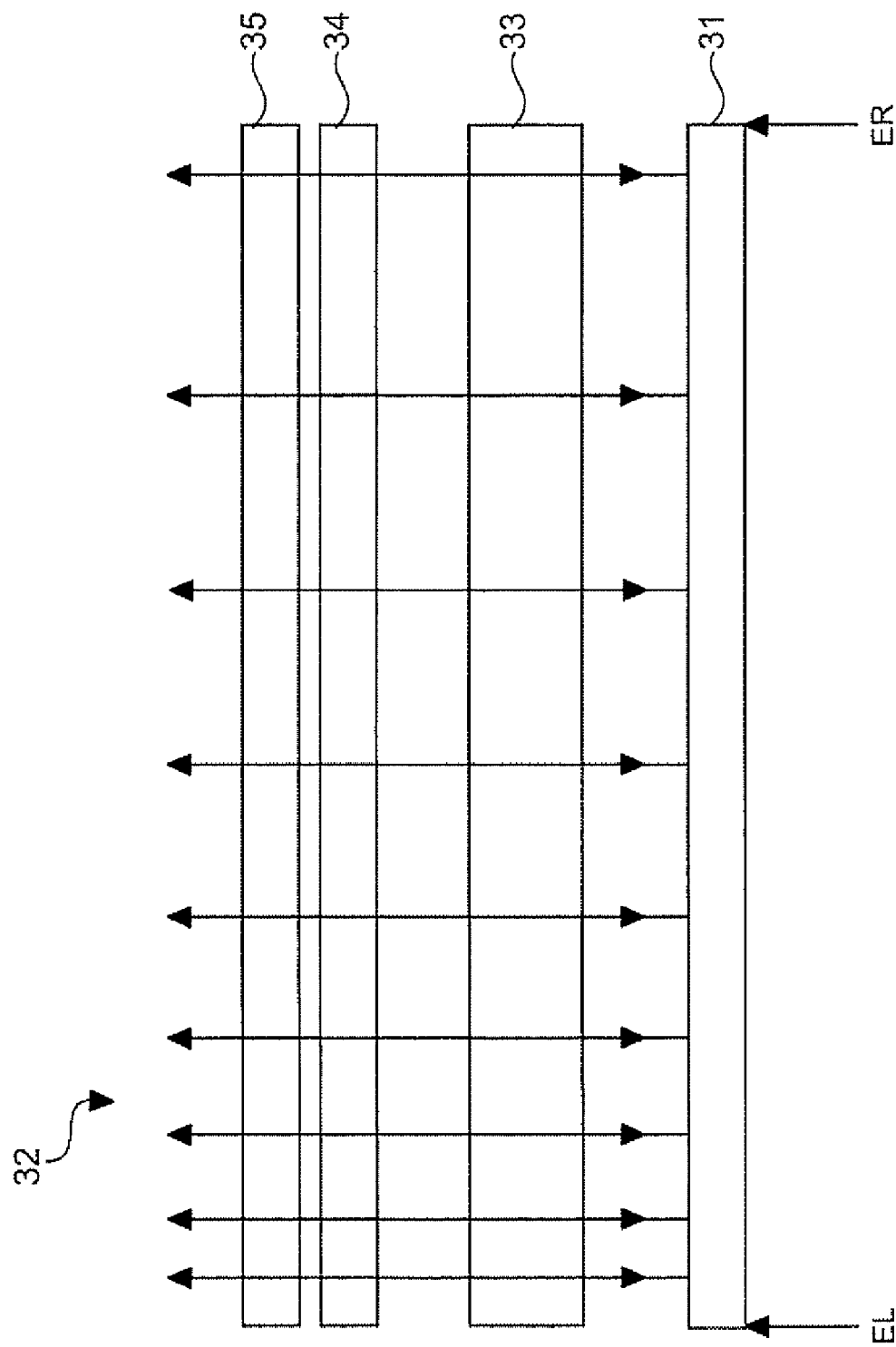
FIG. 14 is a diagram showing the schematic configuration of a light source device provided with a wavelength conversion element and an external resonator.

FIG. 14 shows the schematic configuration of a light source device 32 in which the above-described semiconductor laser 31 is equipped with a wavelength conversion element 33 and an external resonator 35. The external resonator 35 serves to produce a resonance in laser lights coming from each of the light emission sections 12 (refer to FIG. 11) provided to the semiconductor laser 31. The wavelength conversion element 33 is provided on an optical path between the array of the light emission sections 12 and the external resonator 35. The wavelength conversion element 33 converts the wavelength of the laser lights from the light emission sections 12. The wavelength conversion element 33 is exemplified by an SHG element. A wavelength selection element 34 is disposed between the wavelength conversion element 33 and the external resonator 35. The wavelength selection element 34 selectively passes through laser lights of a predetermined wavelength. Note here that the external resonator 35 may be applied to the light source device 30 of FIG. 11.

Figure 15:
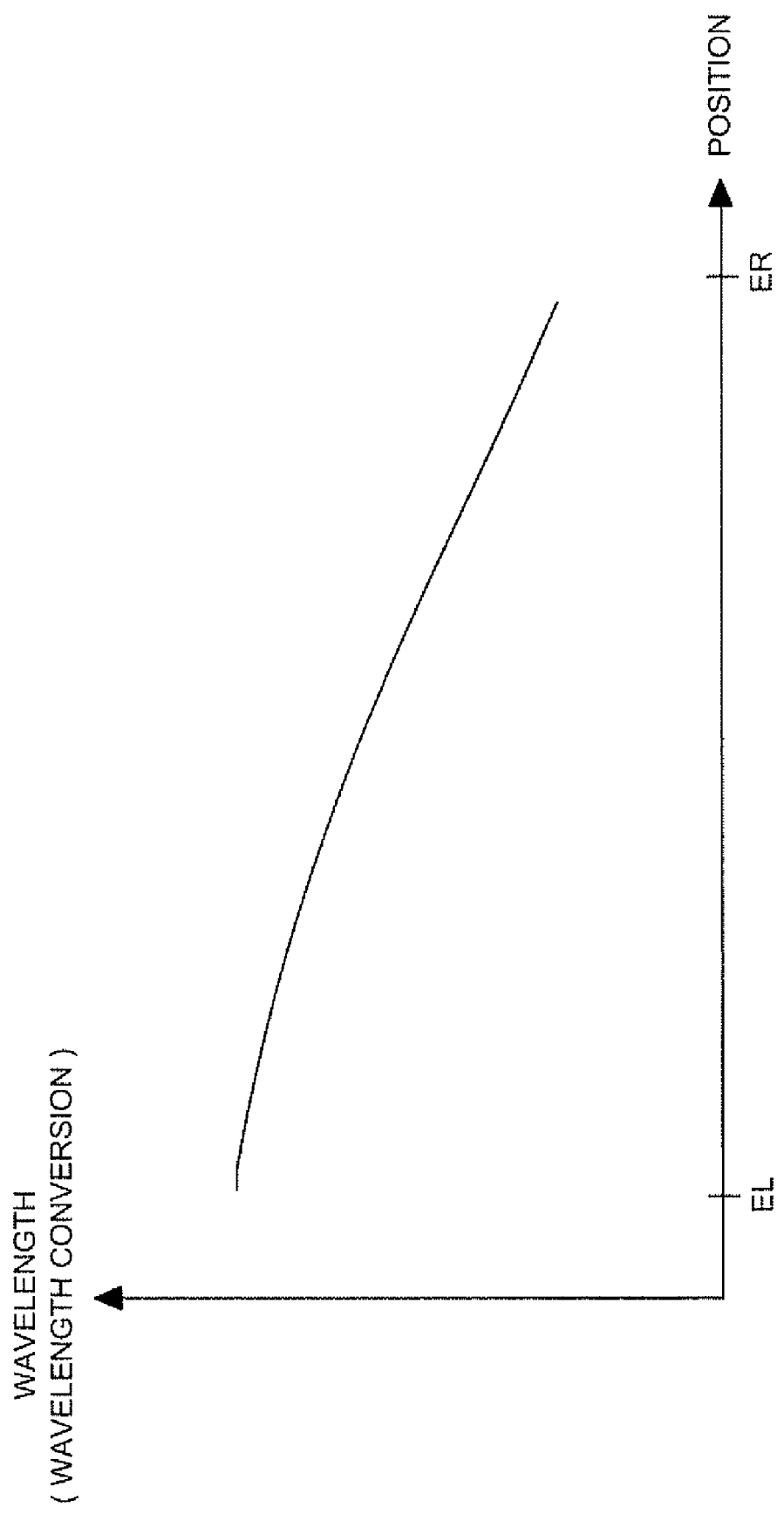
FIG. 15 is a diagram showing the relationship between the position on the wavelength conversion element and the wavelength of laser lights.

FIG. 15 shows the relationship between the position on the wavelength conversion element 33 and the wavelength of laser lights for wavelength conversion. The laser lights to be subjected to wavelength conversion by the wavelength conversion element 33 have the longest wavelength at the position corresponding to the left end portion EL, and show the reduction of wavelength toward the right end portion ER. The wavelength conversion element 33 performs wavelength conversion to laser lights at the position corresponding to any of the light emission sections 12 near the left end portion EL. The laser lights to be subjected to wavelength conversion here are of the wavelength longer than that of laser lights to be subjected to wavelength conversion at the position corresponding to any of the light emission sections 12 near the right end portion ER. The wavelength conversion element 23 with such characteristics of wavelength conversion is derived by forming the polarization-reversed configuration with a pitch smaller for the area closer to the position corresponding to the right end portion ER. By adjusting the pitch of the polarization-reversed configuration corresponding to the wavelength of the laser lights coming from the light emission sections 12, the wavelength conversion for the laser lights from the light emission sections 12 can be performed with a good efficiency.

Figure 16:
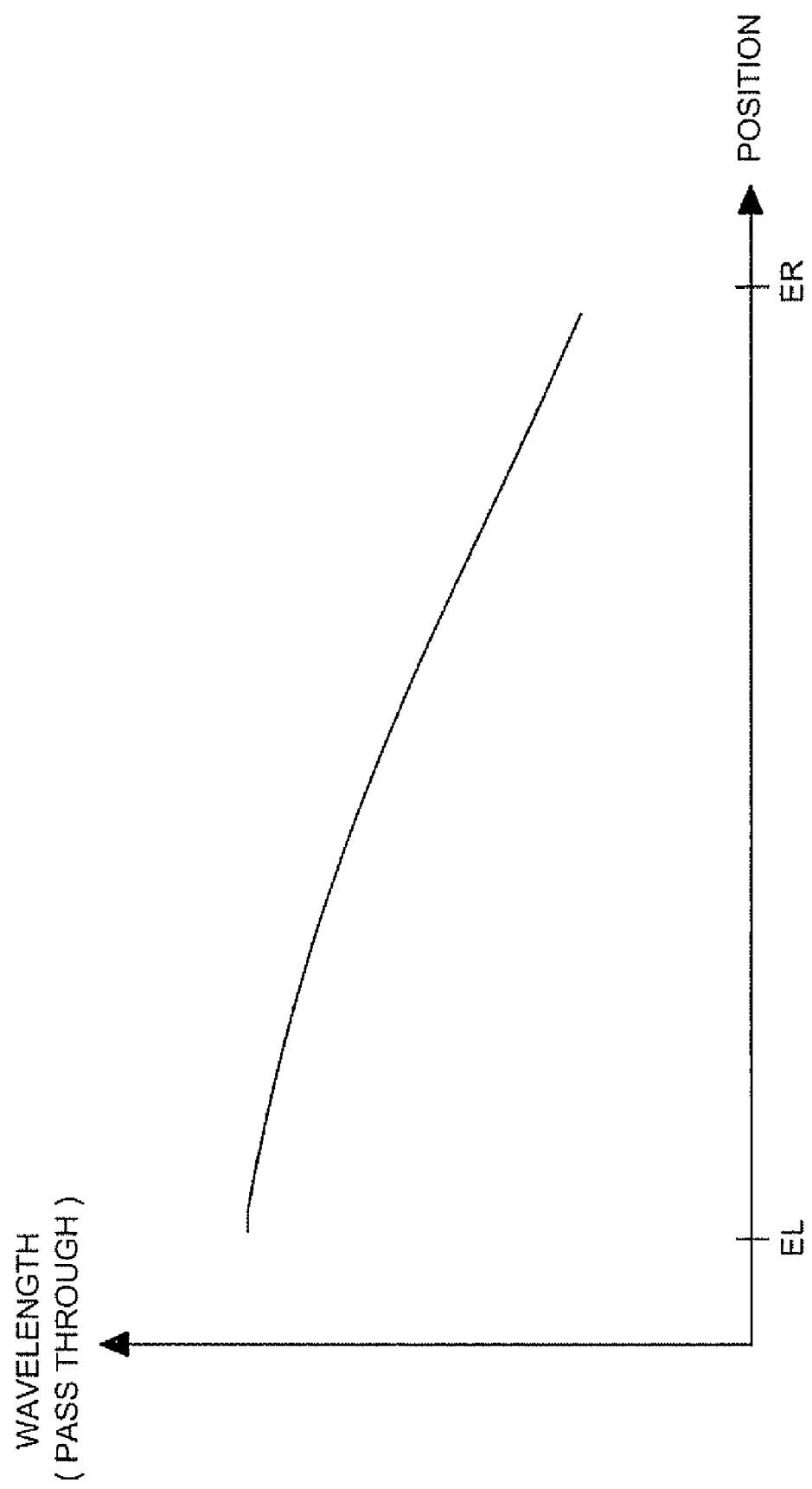

FIG. 16 shows the relationship between the position on the wavelength selection element 34 and the wavelength of laser lights to be passed through by the wavelength selection element 34. The laser lights to be passed through by the wavelength selection element 34 have the longest wavelength at the position corresponding to the left end portion EL, and show the reduction of wavelength toward the right end portion ER. The wavelength selection element 34 passes through laser lights at the position corresponding to any of the light emission sections 12 near the left end portion EL. The laser lights to be subjected to wavelength conversion here are of the wavelength longer than that of laser lights to be passed through at the position corresponding to any of the light emission sections 12 near the right end portion ER. The wavelength selection element 34 with such characteristics of light transmission is exemplified by a dielectric multi-layer whose thickness is reduced from the position corresponding to the left end portion EL toward the position corresponding to the right end portion ER.

By referring back to FIG. 14, the external resonator 35 selectively reflects any laser lights that have been passed through the wavelength conversion element 33 with no wavelength conversion and then passed through the wavelength selection element 34. The external resonator 35 has the characteristics of reflection, irrespective of the position thereon, that can reflect laser lights coming from the light emission sections 12 with any predetermined wavelength range. By making the wavelength selection element 34 to selectively pass through laser lights from the light emission sections 12, resonance can be produced in the laser lights using the external resonator 35. As such, with a simple configuration, resonance can be produced in the laser lights varying in oscillation wavelength.

The wavelength selection element 34 has not only the characteristics of light transmission as such but also the characteristics of passing through laser lights through with wavelength conversion by the wavelength conversion element 33. The laser lights through with wavelength conversion by the wavelength conversion element 33 as such pass through both the wavelength selection element 34 and the external resonator 35, and then are emitted from the light source device 32. By subjecting laser lights varying in oscillation wavelength to wavelength conversion as such, the resulting laser lights coming from the light source device 32 accordingly vary in wavelength. With a supply of laser lights varying in wavelength as such, any possible speckle noise can be reduced. Accordingly, with such a simple method of only adjusting the interval between the light emission sections 12, it becomes able to make a supply of laser lights through with wavelength adjustment. As such, with a simple technique, there are effects of being able to make a supply of lights through with wavelength adjustment in accordance with the objects.

Note here that such a configuration is not the only option for the light source devices 30 and 32, i.e., the interval of the light emission sections 12 is gradually reduced from the right end portion ER toward the left end portion EL. As long as the light emission sections 12 can provide laser lights varying in wavelength, a part of a plurality of light emission sections 12 may be disposed at the same interval.

The light source devices of the embodiments are not restricted to those using a surface-emitting semiconductor laser. As an alternative to such a surface-emitting semiconductor laser, an edge-emitting semiconductor laser will also do. Also in the light sources, a semiconductor laser is not the only option for use as the light source section, and alternative options include a DPSS (Diode Pumped Solid State) laser, a solid-state laser, a liquid laser, a gas laser, and others. The light source section may be a solid-state light source of any other types, e.g., LED (Light-Emitting Diode) and organic EL (Electroluminescent).

Fourth Embodiment

Figure 17:
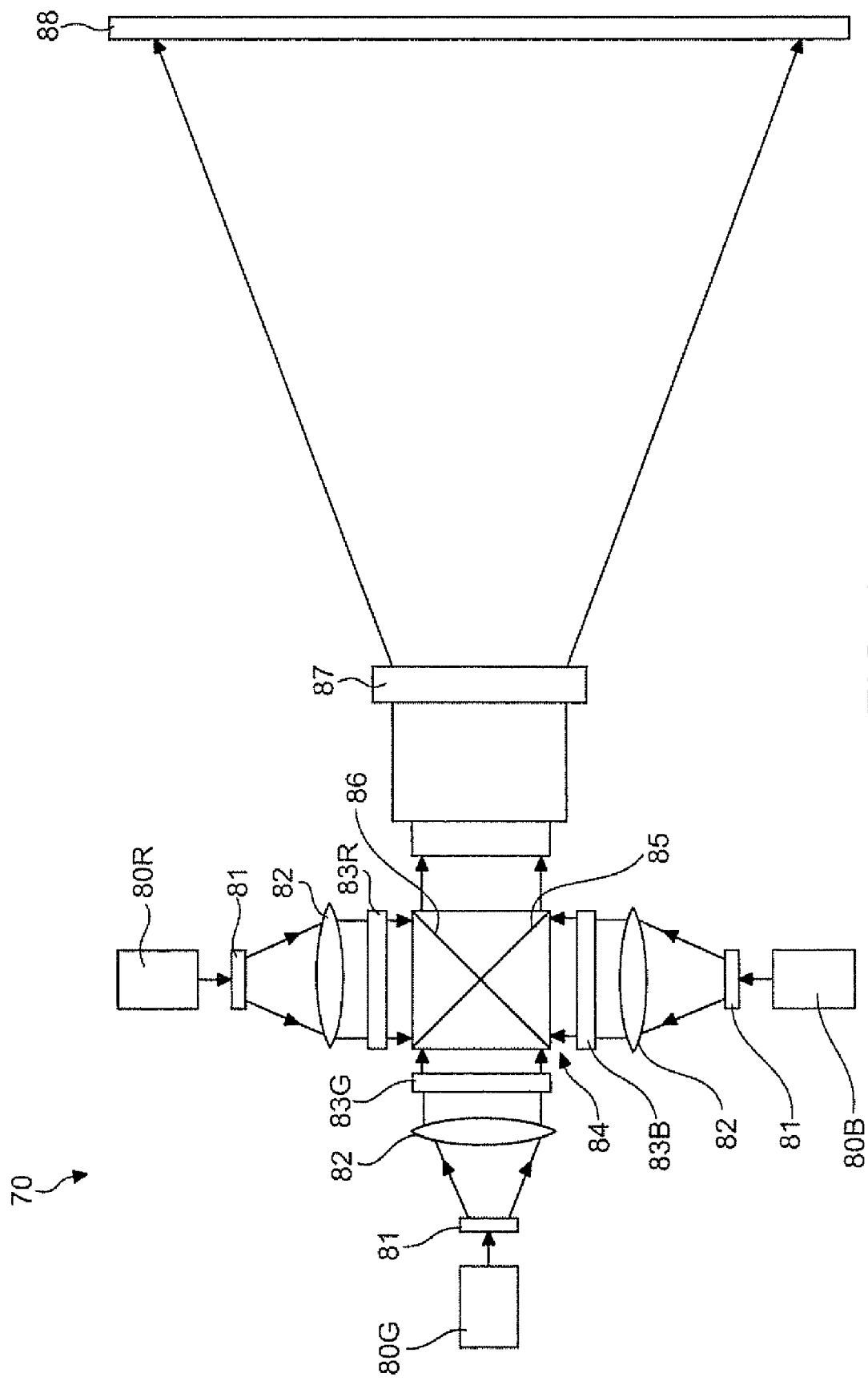
FIG. 17 is a diagram showing the schematic configuration of a projector in a fourth embodiment of the invention.

FIG. 17 shows the schematic configuration of a projector 70 of a fourth embodiment of the invention. The projector 70 is of a front-projection type that makes a supply of lights to a screen 88, and viewers see images being the lights reflected on the screen 88. The projector 70 is provided with a light source device 80R for lights of red (R-lights), a light source device 80G for lights of green (G-lights), and a light source device 80B for lights of blue (B-lights). The projector 70 displays images using lights coming from these light source devices 80B, 80G, and 80B, for lights of three colors.

The light source device 80R for R-lights serves to make a supply of R-lights. The light source device 80R for R-lights can be of the same configuration as the light source device 10 (refer to FIG. 1) described in the first embodiment. The light source device 80R for R-lights is provided with a semiconductor laser for supply of R-lights. A diffusion element 81 serves to shape and increase the size of an illumination area, and make uniform the distribution of amount of laser lights in the illumination area. Such a diffusion element 81 is exemplified by a CGH (Computer Generated Hologram) being a diffraction optical element. A field lend 82 collimates the laser lights from the diffusion element 81, and directs the resulting lights to a spatial light modulation device 83R for R-lights. These components, i.e., the light source device 80R for R-lights, the diffusion element 81, and the field lens 82, configure an illumination device for illuminating the spatial light modulation device 83R for R-lights, The spatial light modulation device 83R for R-lights serves to modulate the R-lights coming from the illumination device in accordance with an image signal, and is a transmissive liquid crystal display device. The R-lights after modulation by the spatial light modulation device 83R for R-lights are directed to a cross dichroic prism 84 being a color combination system.

The light source device 80G for G-lights serves to make a supply of G-lights. The light source device 80G for G-lights can be of the same configuration as the light source device 13 (refer to FIG. 3) described in the first embodiment. The light source device 80G for G-lights supplies G-lights by subjecting laser lights from a semiconductor laser to wavelength conversion. After passing through the diffusion element 81 and the field lens 82, the laser lights are directed to a spatial light modulation device 83G for G-lights. These components, i.e., the light source device 80G for G-lights, the diffusion element 81, and the field lens 82, configure an illumination device for illuminating the spatial light modulation device 83G for G-lights. The spatial light modulation device 83G for G-lights serves to modulate the G-lights coming from the illumination device in accordance with an image signal, and is a transmissive liquid crystal display device. The G-lights after modulation by the spatial light modulation device 83G for G-lights are directed to the cross dichroic prism 84 from the direction different from that for the R-lights.

The light source device 80B for B-lights serves to make a supply of B-lights. The light source device 80B for B-lights can be of the same configuration as the light source device 13 (refer to FIG. 3) described in the first embodiment. The light source device 80B for B-lights supplies B-lights by subjecting laser lights from a semiconductor laser to wavelength conversion. After passing through the diffusion element 81 and the field lens 82, the laser lights are directed to a spatial light modulation device 83B for B-lights. These components, i.e., the light source device 80B for B-lights, the diffusion element 81, and the field lens 82, configure an illumination device for illuminating the spatial light modulation device 83B for B-lights. The spatial light modulation device 83B for B-lights serves to modulate the B-lights coming from the illumination device in accordance with an image signal, and is a transmissive liquid crystal display device. The B-lights after modulation by the spatial light modulation device 83B for B-lights are directed to the cross dichroic prism 84 from the direction different from those for the R- and G-lights. The transmissive liquid crystal display device is exemplified by an HTPS (High Temperature Polysilicon) TFT (Thin-Film Transistor) liquid crystal panel.

The cross dichroic prism 84 is provided with two dichroic films 85 and 86, which are so disposed as to substantially orthogonal to each other. The first dichroic film 85 reflects the R-lights but passes through G- and B-lights. The second dichroic film 86 reflects the B-lights, and passes through the R- and G-lights. Such a cross dichroic prism 84 combines together the R-, G-, and B-lights coming from all different directions, and emits the resulting lights in the direction of a projection lens 87. The projection lens 87 then directs the lights provided by the cross dichroic prism 84 in the direction of the screen 88 for image projection.

By using the light source devices 80R, 80G, and 80B of the configuration similar to, respectively, the light source devices 10 and 13, it becomes possible to easily supply laser lights suited to the object of light emission with a high efficiency. This thus favorably achieves the effects of being able to display bright images with a simple technique. Furthermore, by using the light source devices of the configuration similar to the light source device of the second or third embodiments, it becomes possible to easily supply laser lights suited to the object of reduction of speckle noise, thereby enabling display of high-quality images.

The projector 70 does not restrictively use a transmissive liquid crystal display device as a spatial light modulation device. For the spatial light modulation device, possible options include an LCOS (Liquid Crystal On Silicon), a DMD (Digital Micromirror Device), a GLV (Grating Light Valve), and others. The projector 70 is not restrictively configured as including a spatial light modulation device for lights of each color. Alternatively, the projector 70 may be so configured as to modulate lights of two or three colors with a spatial light modulation device provided therein. Still alternatively, the projector 70 may be so configured as to display images through scanning of laser lights being the modulation results in accordance with an image signal.

The projector may be a rear projector that makes a supply of lights to one surface of a screen, and viewers see images being the lights emitted from the remaining surface of the screen. Moreover, the light source devices of the embodiments of the invention are not restrictively applied to a projector, and may be applied to an exposure device that performs exposure using laser lights, or to a monitor device that monitors any object illuminated by laser lights.

As described in the foregoing, the light source devices of the embodiments of the invention are suitable for the use in a projector.

The entire disclosure of Japanese Patent Application No. 2007-041851, filed Feb. 22, 2007 is expressly incorporated by reference herein.

What is claimed is:

1. A light source device comprising:
   a plurality of light emission sections disposed in parallel with an interval;
   an external resonator for producing a resonance in a light coming from the plurality of light emission sections; and
   a wavelength conversion element provided to an optical path between an array of the plurality of light emission sections and the external resonator for performing wavelength conversion to the light coming from the plurality of light emission sections, wherein
   the interval near a center portion in the array is narrower than the interval near each end portion in the array,
   the interval gradually increases from the center portion of the array to each end portion of the array,
   the plurality of light emission sections are spaced so as to cause a substantial difference in temperature between the light emission sections, such that a temperature at a position corresponding to any of the plurality of light emission sections located near the center portion is higher than a temperature at a position corresponding to any of the plurality of light emission sections located near the end portions,
   the substantial difference in temperature between the light emission sections causes a distribution of wavelengths corresponding to the plurality of light emission sections,
   the wavelength conversion element is configured to convert the distribution of wavelengths, and
   at the position corresponding to any of the plurality of light emission sections located near the center portion, the wavelength conversion element performs the wavelength conversion to a light of a wavelength longer than a wavelength of a light to be subjected to the wavelength conversion at the position corresponding to any of the plurality of light emission sections near the end portions.

2. The light source device according to claim 1, further comprising a wavelength selection element provided between the wavelength conversion element and the external resonator, wherein at the position corresponding to any of the plurality of light emission sections located near the center portion, the wavelength selection element passes through a light of a wavelength longer than a wavelength of a light to be passed through at the position corresponding to any of the light emission sections near the end portions.

3. The light source device according to claim 1, wherein the light emission sections each emit a laser light.

4. A projector comprising:

the light source device of claim 1; and a spatial light modulation device that modulates, in accordance with an image signal, a light from the light source device.

* * * * *